(12) United States Patent  
Chang et al.

(10) Patent No.: US 9,340,408 B2  
(45) Date of Patent: May 17, 2016

(54) SENSOR CHIP HAVING A MICRO INDUCTOR STRUCTURE

(71) Applicant: National Tsing Hua University, Hsinchu (TW)

(72) Inventors: Heng-Chung Chang, Hsinchu (TW); Wei-Leun Fang, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 38 days.

(21) Appl. No.: 14/070,109

(22) Filed: Nov. 1, 2013

(65) Prior Publication Data

US 2014/0339653 A1   Nov. 20, 2014

(30) Foreign Application Priority Data

May 20, 2013   (TW) .................................. 102117811

(51) Int. Cl.  
*H01L 41/113*   (2006.01)  
*B81B 3/00*   (2006.01)  
*H01L 41/12*   (2006.01)

(52) U.S. Cl.  
CPC ............ *B81B 3/0021* (2013.01); *H01L 41/125* (2013.01); *B81B 2201/0264* (2013.01)

(58) Field of Classification Search  
CPC ...... B81B 3/0072; B81B 3/0021; B81B 3/00; H01L 41/113  
USPC .......................................................... 257/415  
See application file for complete search history.

(56) References Cited

U.S. PATENT DOCUMENTS

| | | | | |
|---|---|---|---|---|
| 5,850,045 | A * | 12/1998 | Harada ................... G01L 3/102 73/779 |
| 2002/0168130 | A1* | 11/2002 | Chaparala .......... G02B 26/0841 385/16 |
| 2006/0220776 | A1* | 10/2006 | Fujiwara ....................... 336/200 |
| 2010/0109686 | A1* | 5/2010 | Zhe et al. ....................... 324/698 |
| 2012/0161582 | A1* | 6/2012 | Chung et al. .................. 310/339 |

* cited by examiner

*Primary Examiner* — Asok K Sarkar  
*Assistant Examiner* — Dmitriy Yemelyanov  
(74) *Attorney, Agent, or Firm* — Birch, Stewart, Kolasch & Birch, LLP

(57) ABSTRACT

A sensor chip has a supporting structure layer and a micro-inductor layer formed on the supporting structure layer and having an inductance. The micro-inductor layer comprises an insulating layer, at least one magnetic layer, and a micro-coil layer. When an external physical quantity is applied on sensor chip, the micro-inductor layer can deform correspondingly to generate a variation of the inductance. The variation of the inductance can be measured by an inductance measurement circuit. The inductance measurement circuit can be an external circuit or be integrated into the sensor chip.

13 Claims, 4 Drawing Sheets

SENSOR CHIP HAVING A MICRO INDUCTOR STRUCTURE

BACKGROUND OF THE INVENTION

1. Field of the Invention

The present invention relates to a sensor chip having a micro inductor structure, especially to a sensor chip comprising at least one magnetic layer with the magnetostrictive property and a micro-inductor winding.

2. Description of Related Art

Currently, the sensor chip such as a pressure sensor chip, generally can be divided into the piezoresistive, capacitive or piezoelectric type. However, there are some drawbacks of those sensor chips. For example, the piezoresistive type has the drawback of poor temperature stability, and capacitive type exists the drawback of poor linearity. The piezoelectric type has the drawback of high cost.

In the prior art, the sensor chip employed the sensing principle of the inverse magnetostrictive effect has high sensitivity and temperature stability. However, it requires preparing an additional pinning film in the manufacturing process, which increases the complexity of the process and the cost.

Therefore, how to effectively integrate the magnetic materials as well as its inverse magnetostrictive effect with existing mature semiconductor process or MEMS process will be an important issue. It includes to design and to fabricate a sensor chip which has a high sensitivity and temperature stability at the same time, meanwhile is more cost effective than the aforementioned sensors.

SUMMARY OF THE INVENTION

The technical problem solved by the present invention is to provide a sensor chip comprising a micro-inductor structure, which can achieve low cost, easy to manufacture, high sensitivity, and temperature stability in the same time.

In order to solve the above-mentioned technical problem, a technical solution provided by the present invention is: a sensor chip, comprising: a supporting structure layer; and a micro-inductor layer formed on the supporting structure layer and having an inductance. The micro-inductor layer further comprising: an insulating layer; at least one magnetic layer disposed at a side of the insulating layer; and a micro-coil layer disposed inside the insulating layer and surrounded by the insulating layer. Wherein, the micro-coil layer has a plurality of coils as an inductor winding of the micro-inductor layer, and the micro-coil layer insulates from the magnetic layer through the insulating layer. In application, when an external physical quantity applies on the sensor chip, the micro-inductor layer deforms correspondingly so as to change the inductance of the micro-inductor layer.

Wherein, the micro-coil layer is a planar coil, and coil turns of the planar coil are parallel to each other and disposing inside insulating layer.

Wherein, the micro-coil layer is a spiral coil, a solenoid coil, a toroid coil, or a meander coil.

Wherein, the external physical quantity is an acceleration, an angular velocity, a pressure, a sound wave, a magnetic field or a flow field.

Wherein, the magnetic layer comprises a first magnetic layer and a second magnetic layer, and the first magnetic layer is disposed at a lower side of the insulating layer and the second magnetic layer is disposed at an upper side of the insulating layer, and the micro-coil layer is disposed between the first magnetic layer and the second magnetic layer.

Wherein, the supporting structure layer is made of silicon (Si), glass or composite material, and the magnetic layer is made of CoFeB, nickel (Ni), Co—Ni, or ferrite.

Wherein, the insulating layer is made of polymer material or dielectric material, wherein, the polymer material is polyimide and the dielectric material is silicon dioxide ($SiO_2$) or silicon nitride ($Si_3N_4$).

Wherein, the micro-inductor layer links to an inductance measurement circuit by a wire connection or a wireless transmission, wherein, the inductance measurement circuit is for measuring a variation of the inductance of the micro-inductor layer.

Wherein, the supporting structure layer includes a substrate layer having a first end portion, a second end portion, and a central portion, wherein the first end portion and the second end portion are disposed at two sides of the central portion, and a thickness of the central portion is thinner than a thicknesses of the first end portion and the second end portion.

Wherein, the supporting structure layer is like a cantilever beam structure and has a fixed end portion and a free end portion, wherein, the free end portion can deform relatively to the fixed end portion, and one end of the free end portion connected to the fixed end portion and the other end of the free end portion is provided with a mass block.

The main beneficial effect of the present invention is: employing a micro-inductor layer as the inductive sensing layer to extract the inverse-magnetostriction effect, which is easy for fabrication and compatible with the semiconductor foundries. For instance, if an external physical quantity is applied, the micro-inductor layer would be deformed and induce the inverse magnetostrictive effect on the magnetic layer. The inverse magnetostrictive effect will result in a permeability change, then cause an inductance change of the micro-inductor layer. The change of the inductance can be measured by an inductance measurement circuit, and the inductance measurement circuit can output a measurement signal corresponding to the external physical quantity.

DETAILED DESCRIPTION OF THE PREFERRED EMBODIMENT

Figure 1:
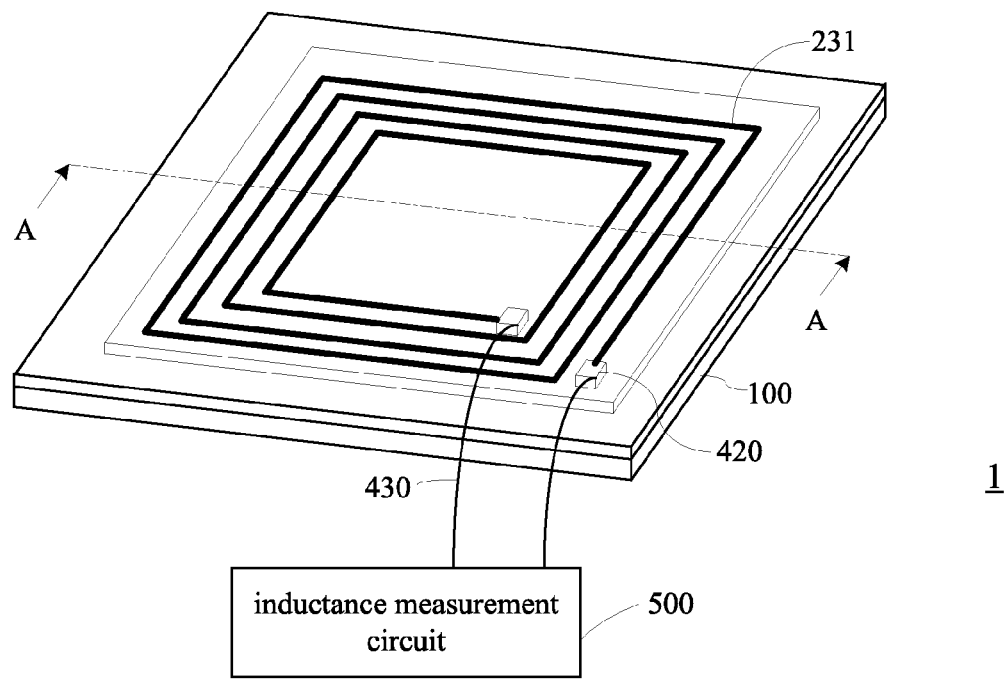
FIG. 1 is a perspective view of a sensor chip according to a first embodiment of the present invention.
Figure 2:
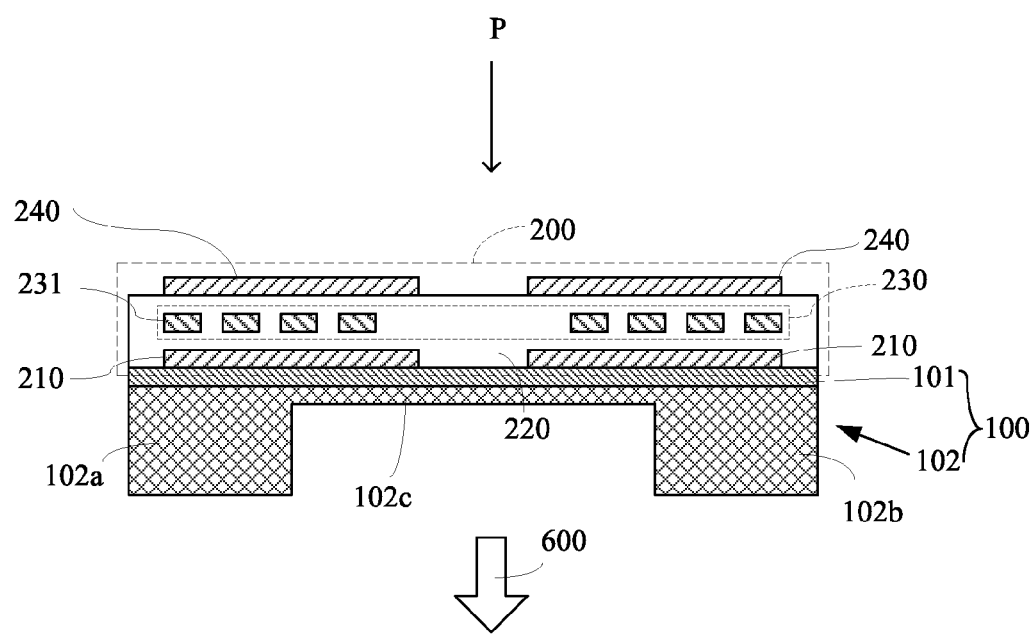
FIG. 2 is a cross-sectional view of the A-A cross section.

The following content combines with the drawings and the embodiment for describing the present invention in detail.

The sensor chip 1 having a micro-inductor structure of the present invention comprises a supporting structure layer 100 and a micro-inductor layer 200.

The supporting structure layer 100 may be made of silicon (Si). In another embodiment, it may not be made of silicon (Si), e.g., glass or composite material, and the present invention is not limited thereto. The micro-inductor layer 200 is a laminar structure and formed on the supporting structure layer 100. In the present embodiment, the supporting structure layer 100 comprises a substrate layer 102, and an oxide layer 101 formed on the substrate layer 102. The oxide layer 101 may be made of silicon oxide ($SiO_2$). However, in another embodiment, it may not require the oxide layer 101.

The substrate layer 102 has a first end portion 102a, a second end portion 102b and a central portion 102c, wherein the first end portion 102a and the second end portion 102b are disposed at two sides of the central portion 102c, and the thickness of the central portion 102c is thinner than the thickness of the first end portion 102a and the second end portion 102b. The central portion 102c can support the micro-inductor layer 200. Because the thickness of the central portion 102c is thinner so that when an external physical quantity, such as a pressure P of the present embodiment applying on the sensor chip 1, the micro-inductor layer 200 would be deformed correspondingly. The central portion 102c can appropriately adjust the stress applied on the micro-inductor layer 200 to prevent the micro-inductor layer 200 from being damaged when the pressure P is too large. However, in another embodiment, if the micro-inductor layer 200 has been well designed, it may not require the central portion 102c.

The micro-inductor layer 200 comprises: a first magnetic layer 210, an insulating layer 220, a micro-coil layer 230, and a second magnetic layer 240. The insulating layer 220 may be made of polyimide. The first magnetic layer 210 disposes on a lower side of the insulating layer 220, and partially covered by the insulating layer 220. The first magnetic layer 210 may be made of CoFeB. The micro-coil layer 230 disposes inside the insulating layer 220, and is covered by the insulating layer 220. The micro-coil layer 230 has a plurality of coils 231 as an inductor winding of the micro-inductor layer 200. And the coils 231 could be linked to an inductance measurement circuit 500.

The linking method may be a wire connection such as an electrical connection line 430 shown in FIG. 1 to achieve the electrical connection. The electrical connection line 430 may be made of conductive material such as aluminum (Al) or copper (Cu). Furthermore, in another embodiment, the linking method may be a wireless transmission such as a magnetic coupling, that is, a magnetic field coupling between the micro-inductor layer 200 and the inductance measurement circuit 500. The foregoing wire connection and wireless transmission can both achieve the technical effect of the present invention. The inductance measurement circuit 500 may be, for example, an inductance-capacitance-resistance meter (LCR meter). The second magnetic layer 240 disposes on an upper side of the insulating layer 220, and the micro-coil layer 230 disposed between the first magnetic layer 210 and the second magnetic layer 240. In the present embodiment, the first magnetic layer 210 and the insulating layer 220 is disposed on the oxide layer 101.

Accordingly, when the external physical quantity P enters into the sensor chip 1 of the present invention, the micro-inductor layer 200 would be deformed correspondingly. In this embodiment, the supporting structure layer 100 is like a clamped plate, and the micro-inductor layer 200 is formed on the supporting structure layer 100. When the external physical quantity P enters, the supporting structure layer 100 and the micro-inductor layer 200 would be deformed in the same direction, e.g., a direction 600. Thereby, because of the deformation, the inverse magnetostriction effect would be induced on the magnetic layers 210 and 240. Consequently, the permeability of the magnetic layers 210 and 240 will be changed, meanwhile, the inductance of the micro-inductor layer 200 would also be changed. The change can be measured by the inductance measurement circuit 500, and the inductance measurement circuit 500 can output a measuring signal corresponding to the external physical quantity P. Thus, the value of the external physical quantity P can be obtained by the relationship between inductance.

Furthermore, the present invention may only dispose one magnetic layer, that is, only dispose the first magnetic layer 210 or the second magnetic layer 240. Disposing one magnetic layer will only decrease the initial inductance value, but it can still achieve the same object of the present invention and the above-mentioned technical effect. When disposing two magnetic layers, the micro-coil layer 230 can be disposed between the first magnetic layer 210 and the second magnetic layer 240, which can reduce magnetic flux leakage and increase the initial inductance, such that the sensor chip 1 of the present invention is more sensitive and stable.

Figure 3A:
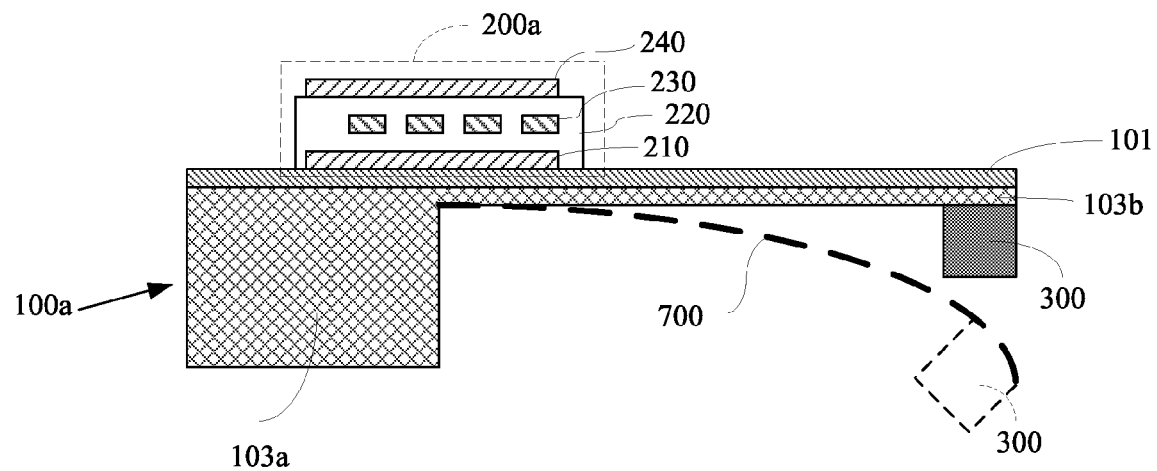
FIG. 3A is a cross-sectional view of a second embodiment of the present invention.
Figure 3B:
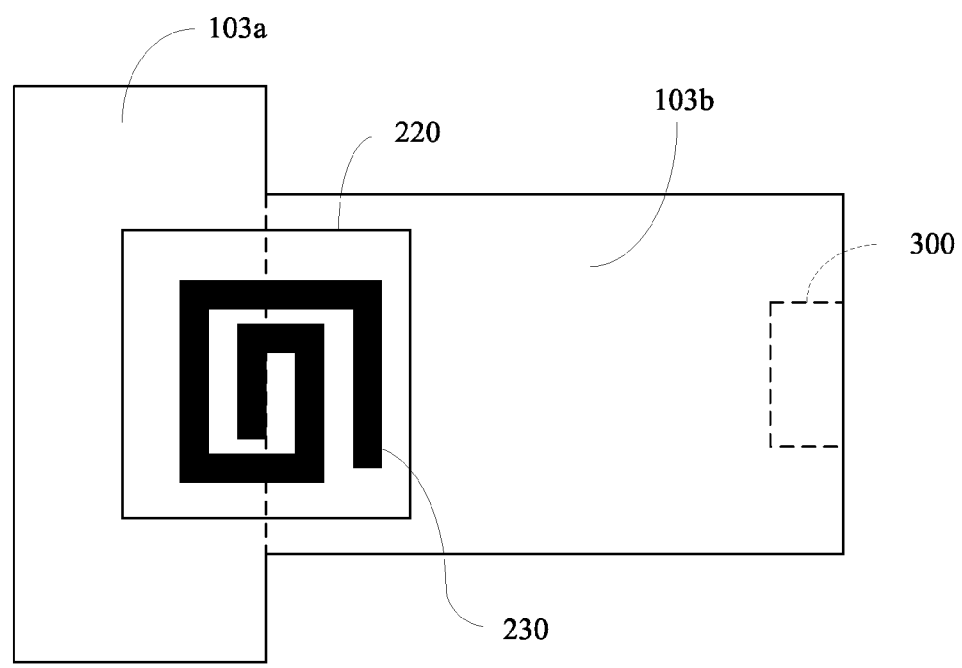
FIG. 3B is a top view of the second embodiment of the present invention.

Furthermore, with reference to FIGS. 3A and 3B, it shows a second preferred embodiment of the present invention. Wherein, FIG. 3A is a cross-section view of the present embodiment, and FIG. 3B is a top view of the present embodiment. The main difference between the present embodiment and the above described embodiment is that the supporting structure layer 100a is like a cantilever beam structure. The micro-inductor layer 200a can be formed on the supporting structure layer 100a by the MEMS fabrication process. The supporting structure layer 100a has a fixed end portion 103a and a free end portion 103b. The free end portion 103b can deform relatively to the fixed end portion 103a. One end of the free end portion 103b connected to the fixed end portion 103a and the other end of the free end portion 103b is provided with a mass block 300. The present embodiment can be used for sensing different external physical quantity, e.g., acceleration. When the acceleration is acting on the mass block 300, the micro-inductor layer 200a will be deformed as a deformation curve 700, as shown in FIG. 3A.

As the mass block 300 moves downward, the free end portion 103b together with the oxide layer 101 and the entire micro-inductor layer 200 are deformed as the deformation curve 700. It will stretch the magnetic layer 210 and 240 to induce the inverse magnetostrictive effect such that the permeability of the magnetic layers 210 and 240 are changed then. At this time, through the inductance measurement of the micro-inductor layer 200, it can achieve the above object of the present invention and the technical effect.

For example, assuming an external physical quantity (such as pressure P) applied on the sensor chip 1, the magnetic layer 210, 240 would be sustained a corresponding stress σ. According to the inverse-magnetostriction effect, the magnetic anisotropy filed induced by the stress σ can be expressed as:

$$Hs = \frac{3\sigma\lambda}{Ms} \qquad \text{formula (1)}$$

Where, λ is the magnetostriction constant, Ms is the saturation magnetization value for the magnetic layer 210 and 240, and the permeability μ can be expressed as:

$$\mu = \frac{4\pi Ms}{Ho - Hs} \qquad \text{formula (2)}$$

Where, Ho is the magnetic anisotropy filed when it not subjected to the stress σ, that is, the external physical quantity does not enter the sensor chip 1, and the value of the Ho can be controlled by the thickness of the thin film deposition or the patterning process.

Combining the formula (1) and (2) to obtain the relationship between the magnetic permeability μ and the stress σ as following:

$$\mu = \frac{4\pi Ms^2}{MsHo - 3\sigma\lambda} \quad \text{formula (3)}$$

From formula (3), the stress σ produced by the external physical quantity and the permeability μ exist a certain relationship, that is, the change of the stress σ will changes the permeability μ. Finally, it causes the inductance of the micro-inductor layer 200 of the sensor chip 1 to be changed.

Besides, from formula (1), it shows that the inverse-magnetostriction effect is proportional to the stress σ. Therefore, by suitable design of the supporting structure layer 100, 100a, it can induce larger stress (σ) even under the same pressure. In other words, the induced larger stress σ will increase the sensitivity of the sensor chip 1 of the present invention.

The following provides an embodiment for detailed description of the manufacturing method of sensor chip 1 of the present invention. With reference to FIG. 4A to 4F, it illustrates schematic cross section view for the fabrication process.

Figure 4A:
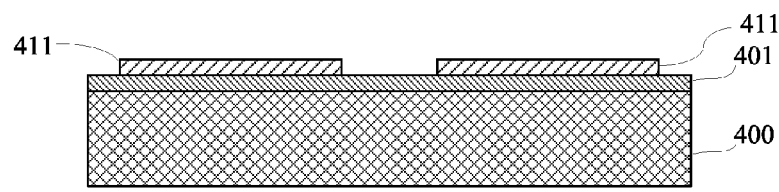
FIG. 4A-4E are cross-sectional views showing the manufacturing process of the present invention.
Figure 4B:
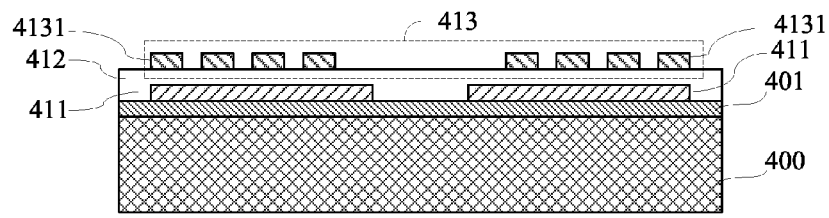

With reference to FIG. 4A, firstly, providing a supporting structure layer 400, for example, the supporting structure layer 400 may be a silicon (Si) substrate; Then, forming an oxide layer 401 on the supporting structure layer 400, for example, when the supporting structure layer 400 is a silicon (Si) substrate, it can use the semiconductor process to form a silicon oxide layer ($SiO_2$) as an electrical insulation layer. Subsequently, forming a micro-inductor layer 410 (shown in FIG. 4E), wherein it includes the following steps:

Please continue to refer to FIG. 4A, forming a first magnetic layer 411, for example, by deposition method, depositing a CoFeB film as the magnetic flux conduction layer of the micro-inductor layer 410; Then, with reference to FIG. 4B, forming a first insulating layer 412 on the oxide layer 401. For example, it uses coating method to coat polyimide as the first insulating layer 412 for the electrical insulation purpose. On the first insulating layer 412, forming a micro-coil layer 413, for example, using the deposition method to deposit an aluminum layer on the first insulating layer 412, and patterning the aluminum (Al) layer in order to form the micro-coil layer 413. The micro-coil layer 413 has a plurality of coil turns 4131 as an inductor winding of the micro-inductor layer 410. Between the micro-coil layer 413 and the first magnetic layer 411, it uses the first insulating layer 412 for electric insulation. Wherein, the patterning process means the use of conventional semiconductor process, mainly including the exposure process, etching process, and developing process so as to fabricate the coil turns 4131.

Figure 4C:
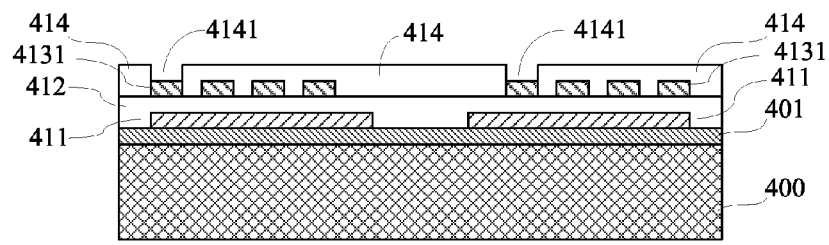

With reference to FIG. 4C, on the first insulating layer 412, it forms a second insulating layer 414, for example, by coating method, coating polyimide as the second insulating layer 414 to electrically insulate the micro-coil layer 413. Then, patterning the second insulating layer 414 in order to expose the pads 4141 of the coil turns 4131 for the sake of manufacturing electrical contact pads (e.g., bonding pad 420 shown in FIG. 4E). In the following measurement procedure, these bonding pads 420 will be connected with external electrical connection lines 430. Subsequently, curing process of the first insulating layer 412 and the second insulating layer 414 will be performed, for example, the curing temperature may be 250 degrees Celsius.

Figure 4D:
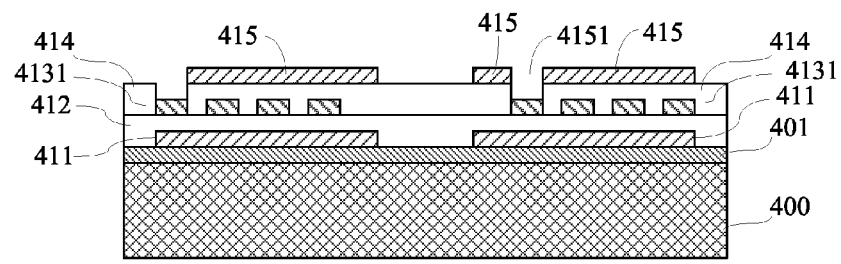
Figure 4E:
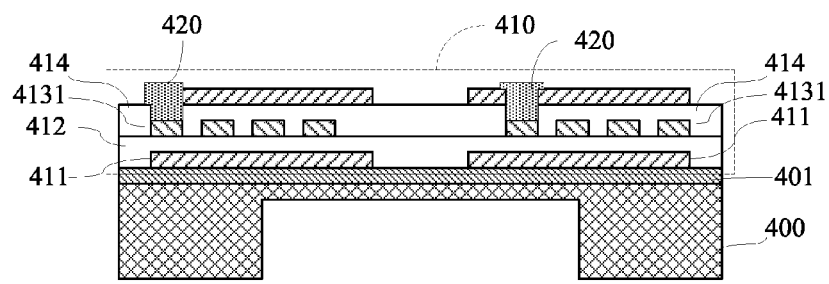

With reference to FIG. 4D, on the second insulating layer 414, forming a second magnetic layer 415, for example, by deposition method, depositing a CoFeB film as the magnetic flux conduction layer of the micro-inductor layer and patterning the second magnetic layer 415 to form via holes 4151. The via holes 4151 are corresponding to the pad holes 4141 to expose the coil turns 4131 for the sake of fabricating bonding pads 420 (shown in FIG. 4E) in the following process. As a result, the electrically linkage with the electric connection line 430 could be implemented by the bonding pads 420 Therefore, the micro-inductor layer 410 could be electrically connected to the inductance measurement circuit 500, as shown in FIG. 1. With reference to FIG. 4E, removing a partial portion of the supporting structure layer 400 could fabricate a clamped plate in this embodiment. The removing process, for example, may be done by the etching or grinding process of the supporting structure layer 400. The person skill in the art should know that in one embodiment, the magnetic layer 210, 240 of the present invention are made of CoFeB, but in another embodiment, they could also be made of nickel (Ni) or Co—Ni or ferrite. The insulating layer 412, 414 may be made of other polymer materials or dielectric materials such as silicon dioxide ($SiO_2$) or silicon nitride ($Si_3N_4$). In addition, in the present embodiment, the micro-coil layer 413 is a planar coil, that is, the coil turns 4131 are parallel to each other and disposing on the first insulating layer 412. In another embodiment, the micro-coils layer 413 could be a spiral coil, a solenoid coil, a toroid coil, or a meander coil by using MEMS process. Besides, the external physical quantity could be an acceleration, an angular velocity, a pressure, a sound wave, a magnetic field or a flow field. The present invention is not limited thereto.

Figure 5:
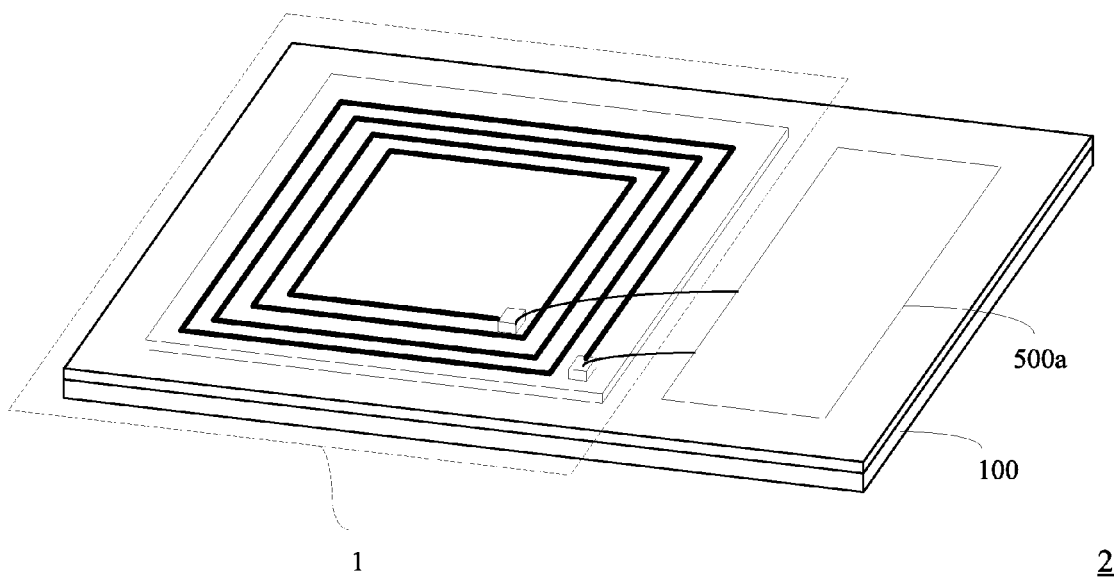
FIG. 5 is a perspective view illustrating integration of the sensor chip and the sensing circuit of the present invention.

With reference to FIG. 5, it is a perspective view illustrating integration of the sensor chip and the inductance measurement circuit of the present invention. The main difference between this embodiment and the foregoing embodiment is that the sensor chip 2 integrates the inductance measurement circuit 500 located outside in the foregoing embodiment. In other words, the sensor chip 2 integrates an inductance measurement circuit 500a with the foregoing sensor chip 1 on the same supporting structure layer 100 or 100a. The operation principle and the function are the same as foregoing mention. It will not discuss again here. The sensor chip 2 can output a measurement signal by a voltage or a current. The measurement signal represents the external physical quantity measured by the sensor chip 2.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A sensor chip for detecting stress induced by external physical quantity, comprising:
    a deformable supporting structure layer; and
    a stress sensing micro-inductor layer formed on the deformable supporting structure layer, the stress sensing micro-inductor layer comprising:
    an insulating layer;
    at least one stress sensing magnetostrictive magnetic layer disposed at a side of the insulating layer; and
    a micro-coil layer disposed inside the insulating layer and surrounded by the insulating layer, wherein the micro-coil layer has a plurality of coils as an inductor winding of the micro-inductor layer, and the micro-coil layer insulates from the at least one stress sensing magnetostrictive magnetic layer through the insulating layer; and a measurement circuit linking to the stress sensing micro-inductor layer by a wire connection or a wireless transmission, wherein the at least one stress sensing magnetostrictive magnetic layer is configured to cause an inverse magnetostrictive effect due to the stress induced by the external physical quantity applied to the stress sensing micro-inductor layer resulting from deformation of the stress sensing micro-inductor layer, and the micro-coil layer is configured to have an inductance change by the inverse magnetostrictive effect, and the measurement circuit is configured to measure the inductance change of the micro-coil layer.

2. The sensor chip according to claim 1, wherein the micro-coil layer is a planar coil, and coil turns of the planar coil are parallel to each other and disposing inside the insulating layer.

3. The sensor chip according to claim 1, wherein the micro-coil layer is a spiral coil, a solenoid coil, a toroid coil, or a meander coil.

4. The sensor chip according to claim 1, wherein the external physical quantity is an acceleration, an angular velocity, a pressure, a sound wave, a magnetic field or a flow field.

5. The sensor chip according to claim 1, wherein the at least one stress sensing magnetostrictive magnetic layer comprises a first magnetic layer and a second magnetic layer, and the first magnetic layer is disposed at a lower side of the insulating layer and the second magnetic layer is disposed at an upper side of the insulating layer, and the micro-coil layer is disposed between the first magnetic layer and the second magnetic layer.

6. The sensor chip according to claim 1, wherein the deformable supporting structure layer is made of silicon (Si), glass or composite material.

7. The sensor chip according to claim 1, wherein the insulating layer is made of polymer material or dielectric material, wherein, the polymer material is polyimide and the dielectric material is silicon dioxide ($SiO_2$) or silicon nitride ($Si_3N_4$).

8. The sensor chip according to claim 1, wherein the inductance measurement circuit is for measuring a variation of the inductance of the stress sensing micro-inductor layer.

9. The sensor chip according to claim 1, wherein the at least one stress sensing magnetostrictive magnetic layer is made of CoFeB, nickel (Ni), Co—Ni, or ferrite.

10. The sensor chip according to claim 1, wherein the deformable supporting structure layer is a cantilever beam structure comprising a fixed end portion, a free end portion, a bridge portion located between and bridging the fixed end portion and the free end portion, and a mass block provided at an end of the free end portion, and wherein a portion of the micro-coil layer and the at least one stress sensing magnetostrictive magnetic layer are located directly above the fixed end portion, a rest of the micro-coil layer and the at least one stress sensing magnetostrictive magnetic layer are located directly above the bridging portion, and no portion of the micro-coil layer and the at least one stress sensing magnetostrictive magnetic layer are located directly above either the free end portion or the mass block.

11. The sensor chip according to claim 10, wherein a thickness of the bridging portion is smaller than a thicknesses of the fixed end portion and a thicknesses of a combination of the free end portion and the mass block, and the thicknesses of the combination of the free end portion and the mass block is smaller than the thicknesses of the fixed end portion.

12. The sensor chip according to claim 1, wherein the deformable supporting structure layer is a clamped plate structure comprising plural fixed end portions and a plate portion, and wherein a portion of the micro-coil layer and the at least one stress sensing magnetostrictive magnetic layer are located directly above the fixed end portion, a rest of the micro-coil layer and the at least one stress sensing magnetostrictive magnetic layer are located directly above the plate portion, and no portion of the micro-coil layer and the at least one stress sensing magnetostrictive magnetic layer are located directly above the center of the plate portion.

13. The sensor chip according to claim 12, wherein a thickness of the plate portion is smaller than thicknesses of the plural fixed end portions.

* * * * *